United States Patent [19]

Ogita et al.

[11] 4,344,187
[45] Aug. 10, 1982

[54] RADIO RECEIVER WITH SYSTEM FOR MAINTAINING OPTIMUM TUNING

[75] Inventors: Minoru Ogita; Shigenobu Kimura, both of Hamamatsu, Japan

[73] Assignee: Nippon Gakki Seizo Kabushiki Kaisha, Hamamatsu, Japan

[21] Appl. No.: 195,474

[22] Filed: Oct. 9, 1980

[30] Foreign Application Priority Data

Oct. 18, 1979 [JP] Japan .................. 54-134682
Jan. 12, 1980 [JP] Japan .................. 55-2324

[51] Int. Cl.³ .......................................... H04B 1/16
[52] U.S. Cl. ................................... 455/182; 455/183
[58] Field of Search ........................... 455/182, 183

[56] References Cited

U.S. PATENT DOCUMENTS

4,240,115 12/1980 Kamiya ........................... 455/182
4,264,977 4/1981 Deiss ................................ 455/182
4,271,530 6/1981 van Deursen ................... 455/182

Primary Examiner—Howard Britton
Attorney, Agent, or Firm—Frishauf, Holtz, Goodman & Woodward

[57] ABSTRACT

A radio receiver comprises a voltage-controlled oscillator acting as a local oscillator, a capacitor to supply a control voltage to the voltage-controlled oscillator, a phase locked loop incorporating the voltage-controlled oscillator and adapted for a preset selection of a broadcast station, a charge/discharge control circuit to charge or discharge the capacitor adapted for automatic or manual selection of a broadcast station, and an automatic frequency control circuit adapted for maintenance of a local oscillator frequency when the broadcast station is received. A control circuit is provided which couples the phase locked loop or charge/discharge control circuit to the capacitor in response to the selection of one of the station select modes and couples the automatic frequency control circuit to the capacitor in response to the reception of the broadcast station in a good receiving condition.

11 Claims, 4 Drawing Figures

RADIO RECEIVER WITH SYSTEM FOR MAINTAINING OPTIMUM TUNING

BACKGROUND OF THE INVENTION

This invention relates to a radio receiver arranged to automatically select a system for maintaining the optimum tuning of the receiver in accordance with the signal receiving condition of the receiver.

As is well known, in order to maintain the tuning of a radio receiver an automatic frequency control (AFC) system is used in many radio receivers. The AFC system is arranged such that, when a tuning error of the receiver is detected in accordance with an output signal of an intermediate amplifier or demodulator an output frequency of a local oscillator is controlled by a negative feedback thereto of a control voltage whose magnitude varies with an amount of tuning error so as to stabilize the local oscillator frequency.

The above AFC system properly functions when the receiver receives a strong broadcast signal. However, it is difficult for such an AFC system to properly function when a weak broadcast signal is received because of difficulty of accurate detection of tuning error. As a result, the local oscillator frequency tends to drift, making the maintenance of tuning of receiver difficult. Particularly, if there is a strong broadcast station or an interference wave in the adjacent frequency range the AFC system fails to lock the local oscillator frequency. In the case of a car radio receiver, the AFC system does not properly operate because the strength of a received broadcast signal always changes.

Radio receivers are known which use a frequency synthesizer tuner using a phase locked loop (PLL) having a voltage-controlled oscillator (VCO) which acts as a local oscillator. With a radio receiver using the phase locked loop the local oscillator frequency can be locked irrespective of the strength of a received broadcast signal. On the other hand, the frequency synthesizer tuner suffers from a disadvantage that since noises appearing at the output of a phase comparator incorporated in the phase locked loop are superimposed on the local oscillator signal the signal-to-noise ratio and the selectivity of the tuner are lowered. Further, with the PLL frequency synthesizer tuner, since the local oscillator frequency is caused to vary stepwise, e.g., in 100 KHz or 200 KHz steps, it is difficult to accurately adjust the intermediate frequency of tuner to the center frequency of an intermediate frequency filter used in the tuner. Accordingly, in practice, many frequency synthesizer tuners are not set to the optimum point of the sensitivity and distortion characteristics.

SUMMARY OF THE INVENTION

An object of this invention is to provide an improved radio receiver.

Another object of this invention is to provide a radio receiver in which a preset selection of a broadcast station is achieved by means of a phase locked loop having a voltage-controlled oscillator acting as a local oscillator and a local oscillator frequency is maintained by an automatic frequency control circuit when the broadcast station is received.

Still another object of this invention is to provide a radio receiver comprising a charge/discharge control circuit for charging or discharging a capacitor coupled to a voltage-controlled oscillator acting as a local oscillator and a local oscillator frequency of the voltage-controlled oscillator is maintained by an automatic frequency control circuit when the broadcast station is received.

Briefly, a radio receiver of this invention comprises a voltage-controlled oscillator acting as a local oscillator to which a control voltage is applied through a capacitor. In response to a station selecting operation a broadcast station select circuit is coupled to the capacitor, charging or discharging the latter so as to vary the local oscillator frequency to select a broadcast station. An automatic frequency control circuit or tuning error detect circuit is coupled to the capacitor to maintain the local oscillator frequency when the broadcast station is received.

The charge/discharge circuit may include DC voltage sources adapted for the automatic selection of broadcast stations, a manually controlled variable DC voltage source adapted for the manual selection of broadcast stations, and a phase locked loop adapted for the preset selection of broadcast stations.

DETAILED DESCRIPTION OF THE PREFERRED EMBODIMENTS

Figure 1:
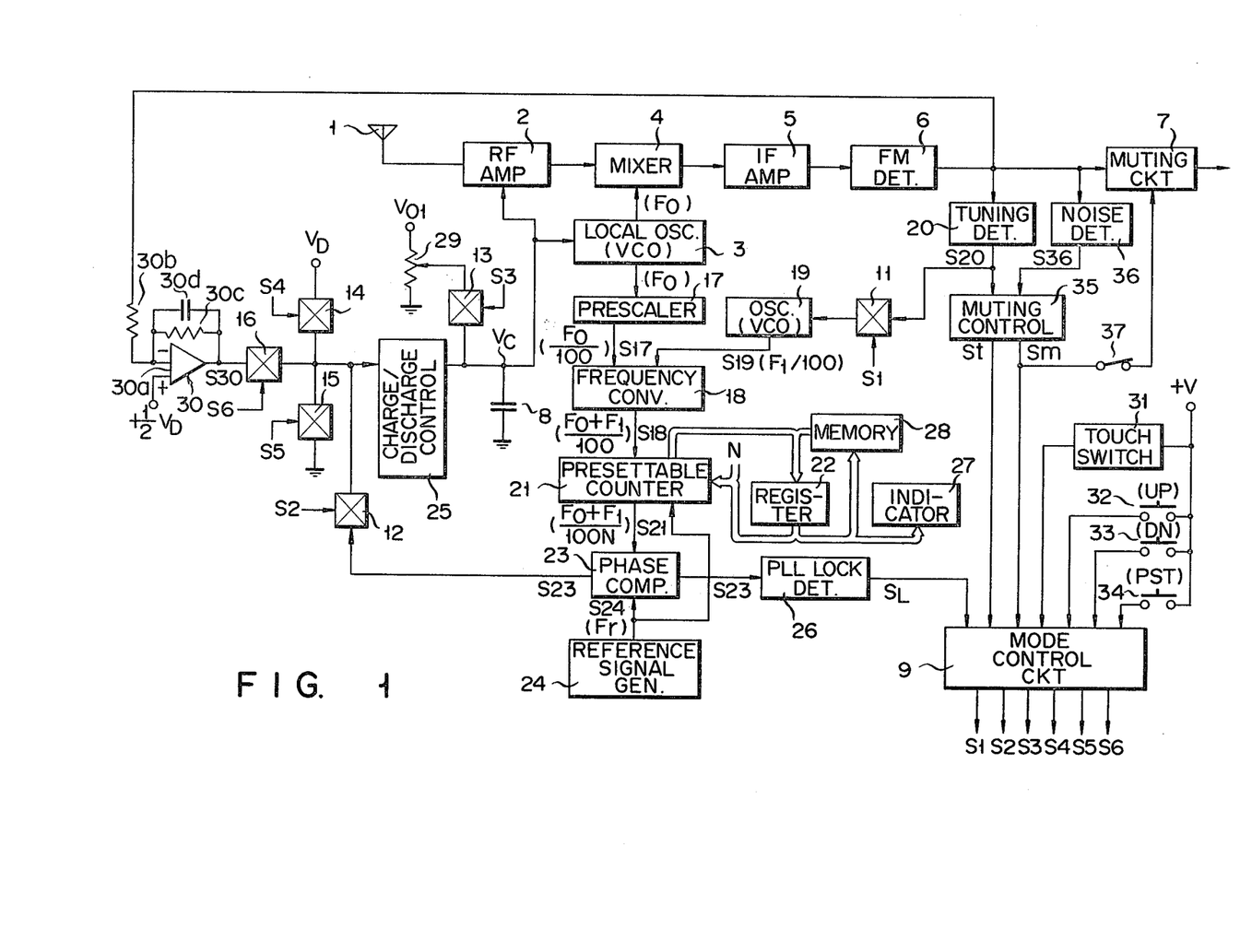
FIG. 1 is a block diagram of an FM radio receiver according to an embodiment of this invention.

Referring now to FIG. 1, there is illustrated an FM radio receiver or tuner according to this invention in block form. An FM broadcast signal received by an antenna 1 is amplified by a radio frequency (RF) amplifier stage 2 and then applied to a mixer stage 4 where it is mixed with a local oscillator signal from a local oscillator 3 to be converted to an intermediate-frequency (IF) FM signal centered at 10.07 MHz. The intermediate-frequency FM signal is amplified by an intermediate-frequency amplifier stage 5 and then applied to an FM detector 6 where an audio component is recovered from the intermediate-frequency FM signal. The recovered audio component is delivered to an audio amplifier system (not shown) through a muting circuit 7.

The local oscillator 3 is formed of a voltage-controlled oscillator (VCO) whose output frequency $F_0$ is controlled by a control voltage $V_C$ (charged voltage on a capacitor 8). The tuned frequency (receiving signal frequency) of the RF amplifier stage 2 is also controlled by the control voltage $V_C$ together with the local oscillator frequency $F_0$.

This invention will be described hereinafter in connection with an FM tuner which is designed for the lower local system in which a local oscillator frequency is 10.7 MHz lower than a receiving signal frequency. Thus, the VCO 3 is arranged to oscillate over a frequency range of 65.3 MHz to 79.3 MHz corresponding to the FM broadcast frequency band 76.0 MHz to 90.0 MHz with a channel spacing of 100 KHz as in Japan. It should be noted, however, that, to meet the US FM broadcast standard which adopts the upper local system, the VCO 3 is arranged to oscillate over a frequency range of 98.7 MHz to 118.7 MHz for the allocated FM broadcast frequency band 88 MHz to 108 MHz with 100 channels spaced 200 KHz apart. In this embodiment, the tuner is designed such that the greater the magnitude of the control voltage $V_C$, the higher both the output frequency $F_O$ of VCO 3 and the tuned frequency of the RF amplifier stage 2 will be.

The receiver of this invention is arranged to operate in MANUAL STATION SELECT mode, AUTOMATIC STATION SELECT mode, PLL mode or AFC mode to vary or hold the control voltage $V_C$ on the capacitor 8. The operation mode in which the tuner is operative depends on the states of analog switches 11 to 16 which are selectively turned ON and OFF by outputs S1 to S6 of a mode control circuit 9 (detailed in FIG. 2). The mode selection will be made clear by the later description.

Turning back to FIG. 1, the local oscillator signal is also applied to a prescaler 17 wherein the local oscillator frequency $F_0$ is divided by a factor of 100 to produce an output signal S17 of a frequency of $F_0/100$ which is then applied to an input of a frequency conversion circuit 18. To the other input of the frequency conversion circuit 18 is applied an output signal S19 of an oscillator 19 which is also a voltage-controlled oscillator (VCO).

The VCO 19 is designed to have a self-running frequency of $F_1/100$ which is one hundredth of 10.7 MHz and is responsive to application thereto of an output signal S20 of a tuning detect circuit 20 when the analog switch 11 is turned ON to shift its output frequency up or down with respect to $F_1/100$. The tuning detect circuit 20 is coupled to the output of FM detector 6 having an S-shaped response centered at 10.7 MHz and may be simply formed of an RC lowpass filter. In this embodiment, the FM detector 6 is arranged to have a DC output reference voltage the magnitude of which is $+\frac{1}{2}V_D$ volts at an input frequency of 10.7 MHz. Therefore, the magnitude of the output signal S20 of the tuning detect circuit 20 increases or decreases with respect to $+\frac{1}{2}V_D$ when the tuner is not exactly tuned to a broadcast signal.

The frequency conversion circuit 18 is arranged to produce the sum of the output frequency ($F_0/100$) of the prescaler 17 and the output frequency ($F_1/100$) of the VCO 19. In order to receive the U.S. FM broadcast signals on the other hand, the frequency conversion circuit 18 is arranged to produce the difference between the output frequency of the prescaler 17 and the output frequency of the oscillator 19. It will be evident that since the frequency ($F_0+F_1$) or ($F_0-F_1$) corresponds to a receiving signal frequency, the output signal S18 of the frequency conversion circuit 18 has a frequency which is one hundredth of the receiving signal frequency. The frequency conversion circuit 18 may be arranged as disclosed in FIG. 3 of copending U.S. Pat. application Ser. No. 165,091 filed July 1, 1980, entitled "RADIO RECEIVER HAVING PHASE LOCKED LOOP FREQUENCY SYNTHESIZER", and assigned to the same assignee as this application.

The output signal S18 of the frequency conversion circuit 18 is applied to a clock input terminal of a presettable counter 21. The presettable counter 21 is arranged to operate either as a variable frequency divider or as a frequency counter in response to a control signal applied thereto from a control circuit not shown. The presettable counter 21 operates as the variable frequency divider only in the PLL mode in which only the analog switch 12 is turned ON. In this mode, the presettable counter 21 has preset input terminals supplied through a register 22 with a preset value (dividing factor) N read out of a memory 28 and thus operates as a frequency divider for frequency-dividing the output signal S18 of the frequency conversion circuit 18 by the factor of N, whereby a frequency divided output signal S21 of $(F_0+F_1)/100 N$ is applied to an input of a phase comparator 23. More specifically, the counter 21 is counted down from the preset value N by the signal S18 and produces a one shot pulse each time the count reaches zero.

In the PLL mode, the other input of the phase comparator 23 is supplied with a reference signal S24 from a reference signal generator 24 which may be comprised of a crystal-controlled oscillator and a frequency divider for frequency-dividing the output frequency of the crystal-controlled oscillator. In this embodiment, a reference output frequency Fr of the reference signal generator 24 is set to be 1 KHz.

The phase comparator 23 is arranged to effect a phase comparison between the reference signal S24 and the output signal S21 of the presettable counter 21, and provide at its output S23 one of tri-state outputs, that is, "open" (high impedance), a logical level 1 (a given positive voltage $V_D$) and a logical level 0 (ground potential), as the result of the phase comparison. The output S23 of the comparator 23 is coupled to a charge/discharge control circuit 25 for the capacitor 8 through the analog switch 12 and to a PLL lock detect circuit 26.

Figure 3:
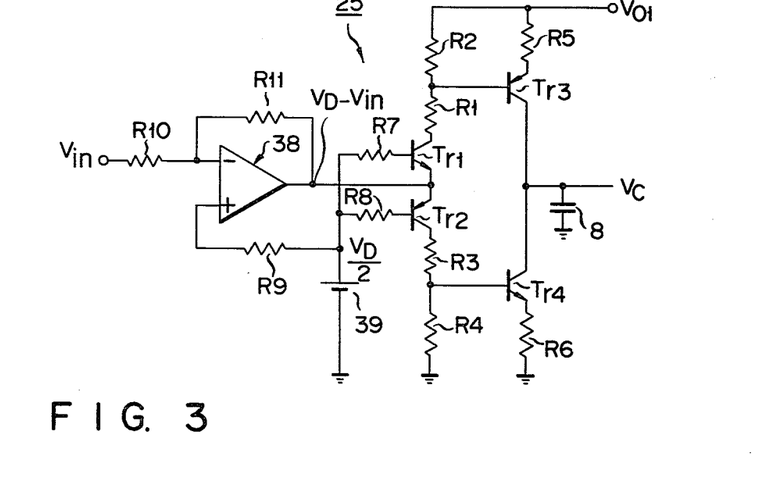
FIG. 3 is a circuit diagram of the charge/discharge control circuit of FIG. 1.

A practical circuit arrangement of the charge/discharge control circuit 25 is shown in FIG. 3 which will be described in detail later. But, the operation of the circuit 25 in the PLL mode will now be briefly described. The charge/discharge control circuit 25 is operative to cause the capacitor 8 to be charged when the output S23 is at logical level 1 ($V_D$) and to be discharged when it is at logical level 0 (ground). When the output S23 is open the charge or discharge of the capacitor 8 is prohibited so that a voltage across the capacitor 8 is held. Accordingly, the above-mentioned control voltage $V_C$ across the capacitor 8 is varied or held in accordance with the output state of the phase comparator 23 to determine the local oscillator frequency $F_0$.

Namely, the system comprised of the local oscillator 3, the prescaler 17, the oscillator 19, the frequency conversion circuit 18, the presettable counter 21, the reference signal generator 24, the phase comparator 23, the charge/discharge control circuit 25 and the capacitor 8 form a phase-locked loop (PLL). The local oscillator frequency $F_0$ is controlled by the control voltage $V_C$ and the PLL is locked in such a condition as given by $$F_0+F_1=N\times 10^5 \text{ (Hz)}$$

As will be evident from the above equation, the preset value (dividing factor) N of the presettable counter 21 in the locked state of PLL, exactly corresponds to a number in three figures of 100 KHz and above of the receiving signal frequency $F_0+F_1$. The number N is also coupled to a visual indicator 27 so that the receiving signal frequency is visually indicated. Incidentally, when the PLL is locked an output signal SL of the PLL lock detect circuit 26 goes high (logical level 1).

In the operation modes other than the PLL mode, the presettable counter 21 operates as a frequency counter. The operation of the counter 21 in the frequency counter mode will be described hereinafter. In this case, the analog switch 12 is turned OFF so that the PLL does not operate and the receiver is set to one of the MANUAL STATION SELECT mode, AUTOMATIC STATION SELECT mode and AFC mode. In the MANUAL STATION SELECT mode, the analog switch 13 is turned ON so that the charge or discharge of the capacitor 8 is directly controlled by a potentiometer 29 connected across a series of voltage $V_{01}$. In the AUTOMATIC STATION SELECT mode, the analog switch 14 or 15 is turned ON so that the charge or discharge of the capacitor 8 is controlled through the charge/discharge control circuit 25. In the AFC mode, the analog switch 16 is turned ON so that an AFC tuning detect circuit 30 coupled to the output of the FM detector 6 controls the capacitor 8 through the charge/discharge control circuit 25. The local oscillator frequency $F_0$ is determined by the control voltage $V_C$ which is set in one of these modes.

In the operation mode in which the presettable counter 21 operates as the frequency counter, the counter 21 is supplied with the reference signal S24 of 1 KHz from the reference signal generator 24 as a timing clock signal to count the number of the output signal S18 of the frequency conversion circuit 18 during one cycle period of the reference signal S24. Accordingly, the count N' in the counter 21 is given by $$N' = [(F_0+F_1)/100] \times 1/1000 = (F_0+F_1) \times 10^{-5}$$

As is evident from the above equation, the count N' coincides with a number in three figures of 100 KHz and above of receiving signal frequency $(F_0+F_1)$. The count N' of the counter 21 is stored in the register 22 and then applied to the visual indicator 27 so that the present receiving signal frequency of the receiver is visually indicated. In this mode, the analog switch 11 is turned ON so that the output frequency $F_1/100$ of the oscillator 19 is variably controlled by the output signal S20 of the tuning detect circuit 20. This will be described in detail later.

The above-mentioned potentiometer 29 adapted for manual tuning is ganged with a tuning knob (not shown) and has one end of its resistance body coupled to the positive voltage $V_{01}$ and the other end thereof coupled to ground. The slider terminal of the potentiometer 2 is coupled to the capacitor 8 through the analog switch 13. There is provided a touch switch 31 associated with the tuning knob the output of which goes high when a user touches the tuning knob. As described later, when the output of touch switch 31 goes high the analog switch 13 is turned ON so that the receiver is set to the MANUAL STATION SELECT mode. In this mode, the control voltage $V_C$ on the capacitor 8, that is, the receiving signal frequency can be freely varied by operating the tuning knob.

As described later, the AUTOMATIC STATION SELECT mode comes into effect when an UP switch 32 or a DOWN switch 33 is actuated. The charge/discharge control of the capacitor 8 in this mode will now be described. During a period of time from the actuation of the UP switch 32 to tuning detection as described later, the analog switch 14 is rendered ON so that a voltage $V_D$ is applied to the input of charge/discharge control circuit 25, gradually charging the capacitor 8. As a result, the magnitude of the control voltage $V_C$ increases to thereby raise the local oscillator frequency $F_0$ and receiving signal frequency. Conversely, during a period of time from the actuation of the DOWN switch 33 to the tuning detection, the analog switch 15 is turned ON so that the input of charge/discharge control circuit 25 is coupled to ground to thereby gradually discharge the capacitor 8. As a result, the local oscillator frequency $F_0$ and receiving signal frequency are lowered.

A preset switch 34 is adapted for the preset selection of broadcast stations. The switch 34 is actuated to select a desired broadcast station in the PLL mode wherein a dividing factor N stored in the memory 28 and corresponding to the desired broadcast station is loaded into the presettable counter 21.

The AFC tuning detect circuit 30 is provided for detection of the magnitude and polarity of a DC tuning error voltage, with respect to the reference voltage $+\frac{1}{2}V_D$, that appears at the output of FM detector 6 when the tuner is not exactly tuned to a broadcast frequency and represents how far the receiving signal frequency of the tuner is displaced from the broadcast frequency, and amplification of the DC tuning error voltage to produce a tuning error signal S30 the magnitude of which varies relative to $+\frac{1}{2}V_D$. More specifically, the detect circuit 30 includes an operational amplifier 30a having its inverting input coupled to the output of FM detector 6 through an input resistor 30b (RA), its noninverting input coupled to a voltage source of $+\frac{1}{2}V_D$, and its output coupled to the inverting input through a parallel combination of a feedback resistor 30c (RB) and a capacitor 30d. With this arrangement, it will be evident that when the DC voltage at the output of FM detector 6 is equal to $+\frac{1}{2}V_D$, that is, the receiver is exactly tuned to a broadcast frequency, the output signal S30 of the AFC tuning detect circuit 30 has a magnitude of $+\frac{1}{2}V_D$. On the other hand, when the tuner is not exactly tuned to a broadcast frequency the detect circuit 30 amplifies the DC tuning error voltage by an amplification factor A (=RB/RA) so that the output signal S30 has a magnitude which is greater or smaller than the DC output voltage of the FM detector 6 which includes the tuning error voltage.

The output of the detect circuit 30 is coupled to the input of charge/discharge control circuit 25 during the AFC mode in which the analog switch 16 is turned ON. As will be evident from the subsequent description of the circuit of FIG. 3, the charge/discharge control circuit 25 is arranged for inhibiting the capacitor 8 from charging and discharging, when the input voltage thereto is equal to $+\frac{1}{2}V_D$, to thereby hold the control voltage $V_C$, and for charging the capacitor 8 when the input voltage is greater than $+\frac{1}{2}V_D$ and discharging the capacitor 8 when the input voltage is smaller than $+\frac{1}{2}V_D$.

Namely, in the AFC mode, the control voltage $V_C$ across the capacitor 8 is controlled by the output signal S30 of the AFC tuning detect circuit 30 until the optimum tuning of the tuner to a broadcast frequency is established, or output signal S30 comes the have a magnitude of $+\frac{1}{2}V_D$.

Next, a muting control circuit 35 will be described. The muting control circuit 35 is arranged to produce a muting control signal Sm and a tuning detect signal St in response to the output signal S20 of the tuning detect circuit 20 and an output signal S36 of a noise detect circuit 36. This noise detect circuit 36 may be comprised of a highpass filter coupled to the output of FM detector 6 to allow high frequency noises of 100 KHz and above to pass therethrough, a rectifier circuit for rectifying the high frequency noises, a smoothing circuit for smoothing the rectified high frequency noises and an amplifier for amplifying an output signal of the rectifier circuit. More specifically, the muting control circuit 35 may be comprised of a window comparator which compares the magnitude of the output signal S20 of the tuning detect circuit 20 with given comparison levels $V_D/2 \pm \alpha$ defining an allowable tuning range of the tuner, a NAND gate having two inputs respectively coupled to the output of the window comparator and the output of noise detect circuit 36 for producing the muting control signal Sm, and a differentiator having an input coupled to the output of the NAND gate for producing the tuning detect signal St. Accordingly, when the magnitude of the output signal S20 falls within the allowable tuning range and the magnitude of output signal S36 is below a given level the muting control signal Sm goes high. Namely, the signal Sm is at a logical level 1 only when the tuner is tuned to a broadcast frequency in a good condition and otherwise at a logical level 0. On the other hand, due to the differentiator circuit the tuning detect signal St goes high during a very short length of time in response to the positive transition of the muting control signal Sm from logical level 0 to logical level 1. The muting control signal Sm is coupled to the muting circuit 7 through a muting switch 37 and to the mode control circuit 9 to which the tuning detect signal St is also coupled.

The muting circuit 7 is enabled to pass an output signal of the FM detector 6 therethrough when the switch 37 is open or when the control signal Sm of logical level 1 is applied thereto with the switch 37 closed.

A practical circuit arrangement of the charge/discharge control circuit 25 will be described with reference to FIG. 3. As shown in FIG. 3, a first complementary pair of transistors Tr1 and Tr2 have their emitters coupled together and their collectors respectively coupled to a positive power supply $V_{01}$ and ground through a first series combination of resistors R1 and R2 and a second series combination of resistors R3 and R4. A second complementary pair of transistors Tr3 and Tr4 have their collectors coupled together, their emitters coupled to the positive power supply $V_{01}$ and ground through resistors R5 and R6, respectively, and their bases coupled to a connection point between the resistors R1 and R2 and a connection point between the resistors R3 and R4, respectively. The above-mentioned capacitor 8 is connected between a connection point of collectors of the transistors Tr3 and Tr4 and ground. The bases of transistors Tr1 and Tr2 are coupled together to a voltage source 39 of $+V_D/2$ through resistors R7 and R8, respectively. The emitters of transistors Tr1 and Tr2 are coupled to the output of an operational amplifier 38 having its noninverting input coupled to the voltage source 39 through a resistor R9 and its inverting input connected to receive an input voltage $V_{in}$ through an input resistor R10. A feedback resistor R11 is coupled between the output and the inverting input of operational amplifier 38. The resistors R10 and R11 have an equal resistance value so that an output voltage $(V_D - V_{in})$ is provided at the output of operational amplifier 38.

Accordingly, when the input voltage $V_{in}$ equals $V_D$ the output voltage of operational amplifier 38 or the emitter voltage of transistors Tr1 and Tr2 becomes zero (ground potential). As a result, the transistors Tr1 and Tr2 are rendered ON and OFF, respectively, and thus the transistors Tr3 and Tr4 are rendered ON and OFF, respectively, causing the capacitor 8 to be charged through the transistor Tr3. On the other hand, when the input voltage $V_{in}$ becomes zero the emitter voltage of transistors Tr1 and TR2 becomes $V_D$. As a result, the transistors Tr1 and Tr2 are rendered OFF and ON, respectively and thus the transistors Tr3 and Tr4 are rendered OFF and ON, respectively, causing the capacitor 8 to be discharged through the transistor Tr4.

When the input voltage $V_{in}$ becomes $V_D/2$ and thus the emitter voltage of transistors Tr1 and Tr2 becomes $V_D/2$, the transistors Tr1 and Tr2 are both rendered OFF and thus the transistors Tr3 and Tr4 are both rendered OFF. As a result, the charge or discharge operation of the capacitor 8 is terminated. As will be evident from the above description, when $V_{in} > V_D/2$ the capacitor 8 is charged, while, when $V_{in} < V_D/2$ the capacitor 8 is discharged.

The charge/discharge control circuit 25 operates as mentioned above during the AUTOMATIC STATION SELECT mode, the PLL mode or the AFC mode. Next, there will be described hereinafter the selective switching of the tuner operation modes with reference to FIG. 2 which shows a practical circuit arrangement of the mode control circuit 9.

Figure 2:
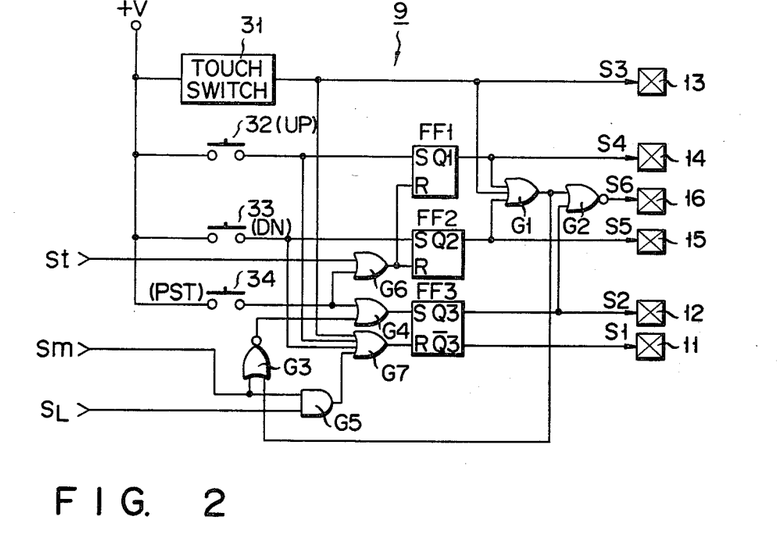
FIG. 2 is a circuit diagram of the mode control circuit of FIG. 1.

First, assume that the tuner is exactly tuned to a certain broadcast frequency in the AFC mode. At this time, since any one of the touch switch 31, UP switch 32, DOWN switch 33 and preset switch 34 which are coupled at one end thereof to a voltage source (+V) is not operated, the outputs of these control switches are all at logical level 0. Further, since the correct tuning of tuner to the broadcast frequency is kept by the AFC control, the muting control signal Sm is high, while the tuning detect signal St and the PLL lock detect signal $S_L$ are both low.

Further, in FIG. 2, flip-flop circuits FF1, FF2 and FF3 and all reset so that their set outputs Q1, Q2 and Q3 are at logical level 0. Namely, the mode control signals S2, S3, S4 and S5 are low, while the control signal S1 is high. Since the output signal of an OR gate G1 is low the control output signal S6 of a NOR gate G2 is high. As a result, the analog switches 11 and 16 are ON, while the analog switches 12, 13, 14 and 15 are OFF. This means that the tuner is operating in the AFC mode as described above.

Next, the AUTOMATIC STATION SELECT mode will be described. In the above-mentioned state, when a user actuates the UP switch 32 to close it momentarily, the flip-flop circuit FF1 is set, causing the control output signal S4 to go high. Simultaneously, the output signal of the OR gate G1 goes high, causing the control signal S6 or the output signal of NOR gate G2 to go low. As a result, the analog switch 14 is turned ON while the analog switch 16 is turned OFF. Upon actuating of the UP switch 32 a high level signal is applied to the reset input R of the flip-flop circuit FF3 through an OR gate G7. However, since the flip-flop circuit FF3 has been reset during the previous AFC mode the high level output signal of the UP switch 32 does not change the state of flip-flop circuit FF3. As a result, the analog switches 11 and 12 remain ON and OFF, respectively. The analog switches 13 and 15 remain OFF.

Due to the above-mentioned fact that the analog switch 16 is turned OFF, while the analog switch 14 is turned ON the control operation of the tuner is switched from the AFC mode to the AUTOMATIC STATION SELECT mode. In this case, as previously described, the capacitor 8 is charged through the analog switch 14 with the result that the magnitude of the control voltage $V_C$ thereacross gradually increases to thereby raise gradually the receiving signal frequency of the tuner. As a result, the tuner is tuned out from the FM broadcast frequency to which the tuner has been tuned during the AFC mode and the muting control signal Sm goes low. When the tuner becomes tuned to the next higher FM broadcast frequency the muting control signals Sm goes high again and thus the tuning detect signal St goes high momentarily.

Since the tuning detect signal St is coupled to the reset input R of flip-flop circuit FF1 through an OR gate G6, this flip-flop circuit is reset again in response to the signal St going high. As a result, the control signal S4 goes low, while the control signal S6 goes high. Accordingly, the analog switch 14 is turned OFF while the analog switch 16 is turned ON so that the AFC mode is reinitiated. Due to the AFC control, the tuner is caused to exactly tune to the newly received FM broadcast frequency.

It is to be noted that the tuning detect signal St goes high not at a point of time when the tuner reaches an optimum tuning point, but at a time when the tuner comes into the allowable tuning condition within the given tuning range (the control range of AFC which allows the tuner to reach the optimum tuning point). At this time, the output signal S20 of the tuning detect circuit 20 includes a tuning error voltage of a slight magnitude. Since the output signal S20 is applied to the oscillator 19 through the analog switch 11 the output frequency $F_1/100$ of the oscillator 19 slightly shifts from 10.7/100 MHz. Suppose now that the output frequency of the oscillator 19 is shifted to $(F_1+f)/100$ MHz. In this condition, even if $(F_0+F_1)$ is not exactly equal to a broadcast frequency, $(F_0+F_1+f)$ equals the broadcast frequency. As a result, the count N' of the presettable counter 21 acting as frequency counter indicates the correct broadcast frequency before the tuner is exactly tuned to the broadcast frequency and is visually indicated by the indicator 27 as a receiving signal frequency. Accordingly, the tuning range of tuner is caused to be greatly broadened in terms of the frequency visual indication. The same thing is also true of the MANUAL STATION SELECT mode.

Next, in a case where the signal receiving condition of the tuner is degraded so that the muting control signal Sm goes low to cause the muting circuit 7 to mute an output signal of the FM detector 6, the output of a NOR gate G3 goes high, causing the flip-flop circuit FF3 to be set. As a result, the control signals S2 goes high while the control signal S6 goes low with the result that the tuner is switched from the AFC mode to the PLL mode. Due to the PLL control the tuner is caused to be stably tuned to the broadcast frequency. Thereafter, if the signal receiving condition of the tuner is improved again, then the AFC control is reinitiated.

The AUTOMATIC STATION SELECT mode provided by operating the DOWN switch 33 is substantially the same as that provided by operating the UP switch 32. Namely, upon momentary closure of the DOWN switch 33 the flip-flop circuit FF2 is set while the flip-flop circuit FF3 is reset because a reset signal is applied thereto through OR gate G7. As a result, the control signals S5 and S6 go high and low, respectively so that the analog switches 16 and 15 are rendered OFF and ON, respectively. Accordingly, the capacitor 8 is discharged so that the control voltage $V_C$ thereacross gradually decreases to gradually lower the receiving signal frequency. When the tuner is tuned to a next lower broadcast frequency and thus the signal St goes high, the flip-flop circuit FF2 is reset again by the signal St applied thereto through OR gate G6, causing the AFC mode to be reinitiated in which the control signals S5 and S6 are low and high, respectively. Also in this case, if the signal receiving condition of the tuner is degraded and thus the muting control signal Sm goes low, then the PLL control is reinitiated.

Next, there will be described the MANUAL STATION SELECT mode. When the user touches the tuning knob ganged with the potentiometer 29 during the AFC mode the output signal S3 of the touch switch 31 goes high to cause the analog switch 13 to be turned ON. The high level control signal S3 is also applied to the reset input R of the flip-flop circuit FF3 which has been reset during the AFC mode through the OR gate G7 and to the NOR gate G2 through the OR gate G1 so that the analog switch 11 remains ON and the analog switch 16 is turned OFF. As a result, the tuner is switched from the AFC mode to the MANUAL STATION SELECT mode in which the analog switch 13 is ON and the control voltage $V_C$, that is, the receiving signal frequency can be freely varied by operating the tuning knob associated with the potentiometer 29. During this mode, when the tuner is tuned to a broadcast frequency in a good signal receiving condition wherein the muting control signal Sm goes high, and thus the user releases the tuning knob, the control signal S3 goes low and the flip-flop circuit FF3 remains reset. As a result, the analog switch 13 is turned OFF and the analog switch 16 is turned ON. Namely, the AFC control is reinitiated to cause the tuner to exactly tune to the manually selected broadcast frequency.

On the other hand, in a case where the user releases the tuning knob when the tuner is not tuned to a broadcast frequency or the tuner is tuned to a broadcast frequency that is not in a good signal receiving condition in which the muting control signal Sm is low, an output signal of NOR gate G3 goes high since an output signal of OR gate G1 goes low when the user releases the touch switch 31. Therefore, an output signal of an OR gate G4 goes high, setting the flip-flop circuit FF3 so that the analog switches 11 and 12 are turned OFF and ON, respectively. Accordingly, the PLL control is reinitiated. The PLL control of this case is effected such that the count N' of the presettable counter 21 which has been acting as frequency counter just before the PLL control is initiated is stored in the register 22 and the count N' is then preset as a dividing factor N in the presettable counter 21 which acts as a divide-by-N counter during the PLL mode. Namely, a receiving signal frequency of the tuner attained when the user releases the tuning knob or a broadcast frequency received by the tuner during the AFC mode is kept by the PLL control. When the PLL is locked the detect signal SL goes high. But, since the muting control signal Sm is low the output signal of an AND gate G5 remains low.

There will now be described the PRESET STATION SELECT mode using the PLL control. The preset switch 34 is momentarily closed and simultaneously a preset value N read out of the memory 28 is preset, as a dividing factor, into the presettable counter 21 through the register 22. Upon closure of the switch 34, a high level output signal is applied to the set inputs of the flip-flop circuit FF3 through an OR gate G4 and to the reset inputs R of the flip-flop circuits FF1 and FF2 through OR gate G6 to thereby set the flip-flop circuit FF3 and reset the flip-flop circuits FF1 and FF2.

When the flip-flop circuit FF3 is set only the analog switch 12 is turned ON whereby the tuner operates under the PLL control. Namely, the PLL control is effected, as is well known, such that a receiving signal frequency of the tuner is caused to correspond to the numerical value N read out of the memory 28.

When the PLL is locked the detect signal St goes high. On the other hand, when the tuner is tuned to a preset broadcast frequency in a good signal receiving condition the muting control signal Sm goes high. As a result, the output signal of AND gate G5 goes high and thus the output signal of OR gate G7 goes high, resetting the flip-flop circuit FF3.

As a result of resetting the flip-flop circuit FF3 the control signals S1 and S6 go high. Namely, the analog switches 11 and 16 are turned ON so that the tuner is switched from the PLL mode to the AFC mode. Accordingly, the optimum tuning point of the tuner can be held by the AFC control.

As will be evident from the foregoing description, the tuner can be automatically switched from the MANUAL STATION SELECT mode, AUTOMATIC STATION SELECT mode or PLL mode to the AFC mode, when the muting control signal Sm goes high. Since, during the AFC mode, the analog switch 12 is turned OFF and the comparison operation of the phase comparator 23 is not effected, there is involved no problem such as the degradation of phase characteristics of local oscillator output resulting from the application of noises generated by the phase comparator 23 to the local oscillator 3 through the charge/discharge control circuit 25.

In a case where there is not attained in any of the operation modes a good signal receiving condition in which the muting control signal Sm goes high, namely, the strength of a selected broadcast signal is weak or an antenna is not well installed, the output signal of NOR gate G3 goes high to set the flip-flop circuit FF3. Accordingly, the tuner operates in the PLL mode in which only the analog switch 12 is turned ON. In this mode, the PLL forms a local oscillator frequency to exactly tune the tuner to the selected broadcast signal. If the muting switch 37 is open the user can listen to even a weak broadcast station.

Although, in the above-mentioned embodiment, the output signals of the muting control circuit 35 are used as control signals for representing the quality of the signal receiving condition of the tuner and switching between the PLL mode and the AFC mode, such a control signal as obtained by detecting the level of an intermediate frequency signal or intermediate frequency noises may be used instead. Further, in the above-mentioned embodiment, the manual selection and automatic selection of broadcast stations are effected independently of the phase locked loop control. However, the manual and automatic selection of broadcast stations may be achieved by changing the preset value N in the presettable counter in the phase locked loop. In this case, it is not required during the selection to operate the presettable counter as a frequency counter.

Figure 4:
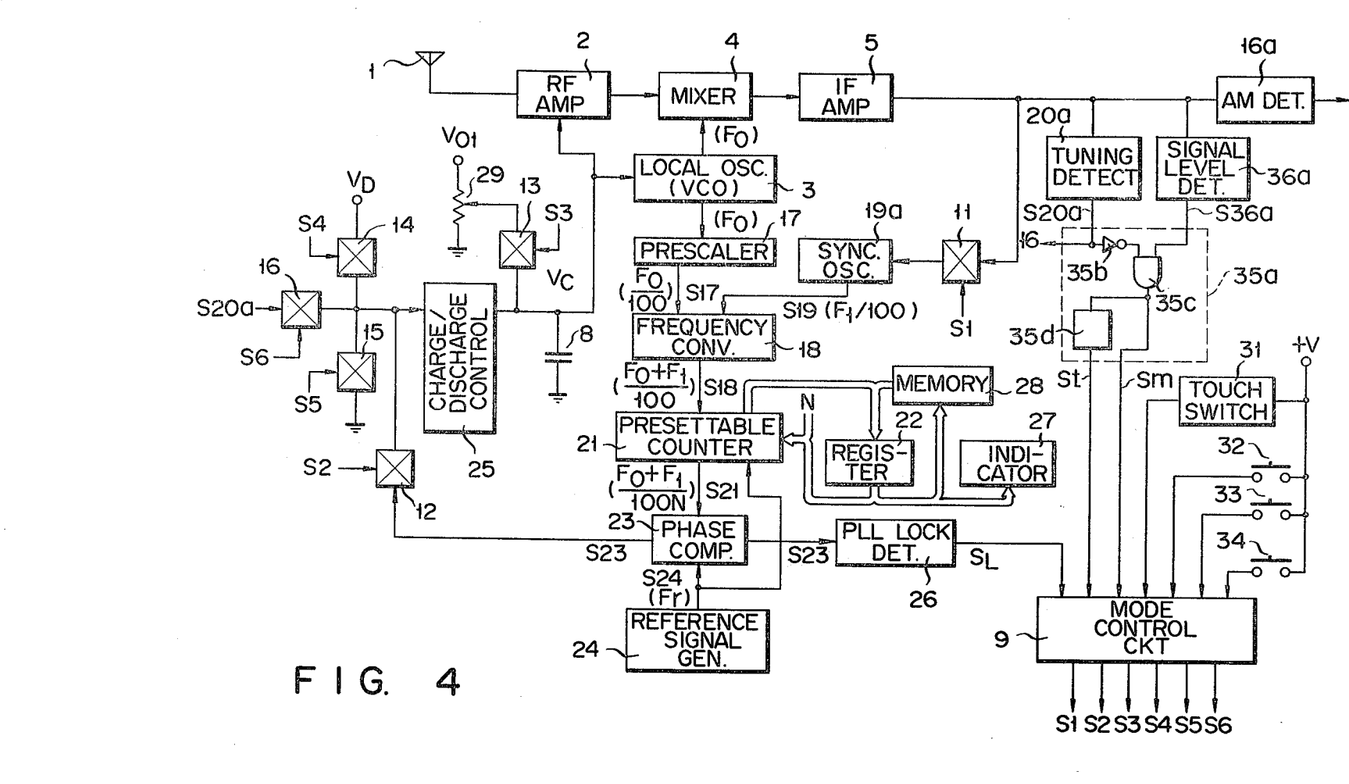
FIG. 4 is a block diagram of an AM radio receiver according to another embodiment of this invention.

This invention may be applied to an AM radio receiver as shown in FIG. 4. In this figure, like reference numerals are used to designate like parts in FIG. 1. An AM detector 16a is coupled to an intermediate frequency amplifier 5. The oscillator 19 is replaced by a synchronous oscillator 19a which is arranged to oscillate at the intermediate frequency of AM system when a switch 11 is open and oscillate in synchronism with an output frequency of the intermediate frequency amplifier 5 when the switch 11 is closed. The switch 11 is connected to the output of the intermediate frequency amplifier 5 as indicated.

To the output of amplifier 5 are connected a tuning detect circuit 20a and a signal level detector 36a. The circuit 20a is an FM detector which has an S-shaped response centered at the intermediate frequency of AM system and may be arranged to produce an output voltage of a logical level 0, when the receiver is exactly tuned to an AM broadcast signal. The signal level detector 36a is arranged to detect the amplitude level of an output signal of the amplifier 5 and produce a logical level 1 output signal when the level of the output signal of the amplifier 5 is above a given level. A control circuit 35a for producing control signals Sm and St is connected to the tuning detect circuit 20a and signal level detector 36a and may be comprised of an inverter 35b coupled to the output of tuning detect circuit 20a, an AND circuit 35c coupled to the output of inverter 35b and output of signal level detector 36a for producing the control signal Sm and a differentiator 35d coupled to the output of AND circuit 35c for producing the control signal St. The control signals Sm and St are coupled to a mode control circuit 9 as in the FM broadcast receiver described before.

What we claim is:

1. A radio receiver comprising:
broadcast signal receiving circuit means arranged to be selectively tuned to one of a plurality of broadcast signals of different frequencies;
a voltage-controlled local oscillator coupled to said receiving circuit means for producing a local oscillator frequency to cause said receiving circuit means to tune to a broadcast signal;
a capacitor coupled to said voltage-controlled local oscillator for supplying a control voltage to said voltage-controlled local oscillator to control the local oscillator frequency;
charge/discharge control circuit means coupled to said capacitor for controlling the magnitude of the voltage acrosss said capacitor, the voltage across said capacitor being said control voltage;
broadcast station selection circuit means selectively coupled to an input of said charge/discharge control circuit means for causing said charge/discharge control circuit means to vary the magnitude of said control voltage across said capacitor to automatically select a broadcast signal;
tuning error detecting means coupled to said signal receiving circuit means for detecting the tuning error of said signal receiving circuit means for a received broadcast signal, said tuning error detecting means being selectively coupled to said charge/discharge control circuit means to control the local oscillator frequency to that said receiving circuit means is exactly tuned to the received broadcast signal;
signal receiving condition detection means coupled to said receiving circuit means for detecting a signal receiving condition of a broadcast signal received by said receiving circuit means; and
control means responsive to said signal receiving condition detecting means for coupling said broadcast station selection circuit means to said charge/discharge control circuit means when a broadcast signal is selected and coupling said tuning error detecting means to said charge/discharge control circuit means only when the selected broadcast signal is satisfactorily received in a good signal receiving condition.

2. The radio receiver according to claim 1 wherein said broadcast station selection circuit means includes a first voltage source for charging said capacitor when coupled to said input of said charge/discharge control circuit means and a second voltage source for discharging said capacitor when coupled to said input of said charge/discharge control circuit means.

3. The radio receiver according to claim 1 wherein said broadcast station selection circuit means includes a phase locked loop including a presettable counter which is preset with a numerical value for controlling said control voltage across said capacitor, when coupled to said input of said charge/discharge control circuit means, so that said local oscillator causes said receiving circuit means to tune to a broadcast signal corresponding to said numerical value preset in said presettable counter.

4. The radio receiver according to claim 1 further including a manually controlled variable voltage source selectively coupled to said capacitor for manually controlling said control voltage across said capacitor so that a broadcast signal is manually selected.

5. A radio receiver comprising:
broadcast signal receiving circuit means arranged to be selectively tuned to one of a plurality of broadcast signals of different frequencies;
a voltage-controlled local oscillator coupled to said receiving circuit means for producing a local oscillator frequency to cause said receiving circuit means to tune to a broadcast signal;
signal receiving condition detecting means coupled to said receiving circuit means for detecting a signal receiving condition of a broadcast signal received by said receiving circuit means;
an automatic frequency control circuit coupled to said receiving circuit means for locking the local oscillator frequency when a broadcast signal is received by said receiving circuit means;
a phase locked loop arrangement for locking the local oscillator frequency when the broadcast signal is selected; and
control circuit means responsive to said signal receiving condition detecting means for selectively coupling said automatic frequency control circuit and said phase locked loop arrangement to said local oscillator so that said automatic frequency control circuit is coupled to said local oscillator only when the received broadcast signal is in a good signal receiving condition.

6. A radio receiver comprising:
broadcast signal receiving circuit means arranged to be selectively tuned to one of a plurality of broadcast signals of different frequencies;
a voltage-controlled local oscillator coupled to said receiving circuit means for producing a local oscillator freqency to cause said receiving circuit means to tune to a broadcast signal;
a capacitor coupled to said voltage-controlled local oscillator for outputting the voltage thereacross a control voltage to said voltage-controlled local oscillator to control the local oscillator frequency;
charge/discharge control circuit means coupled to said capacitor and having an input, said charge/discharge control circuit means holding said control voltage across said capacitor when said input is at a predetermined voltage level or in open state and charging or discharging said capacitor when said input is at a voltage level different from said predetermined voltage level;
a first source of a DC voltage having a magnitude to cause said charge/discharge control circuit means to charge said capacitor when selectively coupled to said input of said charge/discharge control circuit means;
a second source of a DC voltage having a magnitude to cause said charge/discharge control circuit to discharge said capacitor when selectively coupled to said input of said charge/discharge control circuit means;
a control loop selectively coupled to said input of said charge/discharge control circuit means to form a phase locked loop together with said voltage-controlled local oscillator;
tuning error detecting means coupled to said receiving circuit means for detecting a tuning error of said receiving circuit means when receiving a broadcast signal to produce a DC voltage whose magnitude varies with the amount of tuning error, said tuning error detecting means being selectively coupled to said input of said charge/discharge control circuit means to cause said receiving circuit means to exactly tune to said received broadcast signal;
signal receiving condition detecting means coupled to said receiving circuit means for detecting the signal receiving condition of a broadcast signal received by said receiving circuit means;
station select mode switching means;
control circuit means responsive to said signal receiving condition detecting means and said station select mode switching means to couple one of said first and second voltage source and said control loop to said input of said charge/discharge control circuit means in accordance with a designated station select mode and to couple said tuning error detecting means to said input of said charge/discharge control circuit means only with the signal receiving condition of said receiving circuit means for a broadcast signal selected during the designated station select mode is satisfactory.

7. The radio receiver according to claim 6 further comprising a manually controlled voltage source and wherein said station select mode switching means includes a touch switch and said control circuit means is arranged to couple said manually controlled voltage source to said capacitor when a user touches said touch switch.

8. A radio receiving comprising:
broadcast signal receiving circuit means arranged to be selectively tuned to one of a plurality of broadcast signals of different frequencies;
a voltage-controlled local oscillator coupled to said receiving circuit means for producing a local oscillator frequency to cause said receiving circuit means to tune to a broadcast signal;
a capacitor coupled to said voltage-controlled local oscillator for outputting a control voltage to said voltage-controlled local oscillator to control the local oscillator frequency;
charge/discharge control circuit means coupled to said capacitor for controlling the magnitude of the voltage across said capacitor, the voltage across said capacitor being said control voltage;

broadcast station selection circuit means selectively coupled to an input of said charge/discharge control circuit means for causing said charge/discharge control circuit means to vary the magnitude of said control voltage across said capacitor to automatically select abroadcast signal, said broadcast station selection circuit means including a phase locked loop including a presettable counter which is preset with a numerical value for controlling said control voltage across said capacitor, when coupled to said input of said charge/discharge control circuit means, so that said local oscillator causes said receiving circuit means to tune to a broadcast signal corresponding to said numerical value preset in said presettable counter;

tuning error detecting means coupled to said signal receiving circuit means for detecting the tuning error of said signal receiving circuit means for a received broadcast signal, said tuning error detecting means being selectively coupled to said charge/discharge control circuit means to control the local oscillator frequency so that said receiving circuit means is exactly tuned to the received broadcast signal;

signal receiving condition detecting means coupled to said receiving circuit means for detecting a signal receiving condition of a broadcast signal received by said receiving circuit means; and control circuit means responsive to said signal receiving condition detecting means for selectively coupling said automatic frequency control circuit and said phase locked loop arrangement to said local oscillator;

wherein said control circuit means couples said broadcast station selection circuit means to said charge/discharge control circuit means when a broadcast signal is selected and couples said tuning error detecting means to said charge/discharge control circuit means when the selected broadcast signal is satisfactorily received in a good signal receiving condition.

9. The radio receiver according to any one of claims 1, 5, 6, 7 or 8, wherein said signal receiving condition detecting means includes means for detecting whether the noise component level in said receiving circuit means is above a given level or below said given level.

10. The radio receiver according to any one of claims 1, 5, 6, 7 or 8, wherein said signal receiving condition detecting means includes means for detecting whether the broadcast signal is received or not.

11. The radio receiver according to any one of claims 1, 5, 6, 7 or 8, wherein said signal receiving condition detecting means includes means for detecting whether the noise component level in said receiving circuit means, when the broadcast signal is received, is above a given level or below said given level.

* * * * *

United States Patent and Trademark Office
CERTIFICATE OF CORRECTION

PATENT NO. : 4,344,187
DATED : August 10, 1982
INVENTOR(S) : Minoru OGITA, et al It is certified that error appears in the above-identified patent and that said Letters Patent is hereby corrected as shown below:

COLUMN 12 (claim 1), line 57, after "oscillator frequency" change "to" to --so--.

Signed and Sealed this

Twenty-fifth Day of January 1983

[SEAL]

Attest:

GERALD J. MOSSINGHOFF

Attesting Officer   Commissioner of Patents and Trademarks